(12) United States Patent
Matsumoto et al.

(10) Patent No.: US 6,445,558 B1
(45) Date of Patent: *Sep. 3, 2002

(54) SEMICONDUCTOR INTEGRATED CIRCUIT DEVICE HAVING PSEUDO-TUNING FUNCTION

(75) Inventors: Yasuhiro Matsumoto; Mikio Sakurai, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,312

(22) Filed: Dec. 16, 1998

(30) Foreign Application Priority Data

Jul. 9, 1998 (JP) ............................. 10-194270

(51) Int. Cl.[7] ................................. H02H 5/00
(52) U.S. Cl. ........................................ 361/104; 361/115
(58) Field of Search .................................. 361/104, 115; 371/22.4

(56) References Cited

U.S. PATENT DOCUMENTS 5,768,290 A * 6/1998 Akamatsu .................. 371/22.4

* cited by examiner

Primary Examiner—Stephen W. Jackson
(74) Attorney, Agent, or Firm—McDermott, Will & Emery

(57) ABSTRACT

The power supply tuning circuit in accordance with the present invention is provided with a plurality of power supply circuits. Each power supply circuit includes a latch circuit. The latch circuit records a tuning signal. The recorded tuning signal causes the corresponding transistor to switch on/off. In this manner, pseudo-tuning is performed. After a tuning signal is supplied to the latch circuit, the tuning signal is supplied to another power-supply circuit. Thus, pseudo-tuning can be preformed simultaneously for a plurality of power supply circuits.

23 Claims, 11 Drawing Sheets

SEMICONDUCTOR INTEGRATED CIRCUIT DEVICE HAVING PSEUDO-TUNING FUNCTION

BACKGROUND OF THE INVENTION

1. Field of the Invention

The present invention relates to a semiconductor integrated circuit device, and more specifically to a semiconductor integrated circuit device having a configuration for pseudo-tuning an internal power-supply voltage.

2. Description of the Background Art

Because of the influence of process variation and the like, an internal power-supply voltage of a device after the completion of a wafer process does not take a desired value. Thus, there is a need to tune the internal power-supply voltage before the actual use.

A power-supply tuning circuit 900 provided in a conventional semiconductor integrated circuit device will be described with reference to FIG. 10. As an example, a configuration in which an internal power-supply voltage is generated using two pads PAD1 and PAD2 is shown in FIG. 10.

The conventional power-supply tuning circuit 900 shown in FIG. 10 is provided with power-supply circuits 901 and 902, switching circuits 911 and 912, and NAND circuits 921 and 922.

NAND circuit 921 receives at its inputs a tuning signal applied from pad PAD1 and a pseudo-tuning on signal TUNE. NAND circuit 922 receives at its inputs a tuning signal applied from pad PAD2 and pseudotuning on signal TUNE. Pseudo-tuning on signal TUNE is applied from an external pad PAD0.

Switching circuits 911 and 912 each include power-supply selection transistors N90 and N91. Power-supply selection transistors N90 and N91 in switching circuit 911 switch on/off in response to a control signal S1. Power-supply selection transistors N90 and N91 in switching circuit 912 switch on/off in response to a control signal S2.

Switching circuit 911 supplies the outputs from NAND circuits 921 and 922 to a corresponding power-supply circuit 901 in response to control signal S1. Switching circuit 912 supplies the outputs from NAND circuits 921 and 922 to a corresponding power-supply circuit 902 in response to control signal S2.

When the logic high or "H" level pseudo-tuning on signal TUNE is applied from external pad PAD0, power-supply tuning circuit 900 enters a pseudo-tuning mode. In the pseudo-tuning mode, NAND circuits 921 and 922 each output a signal corresponding to a tuning signal applied from outside. Switching circuits 911 and 912 each select a power-supply circuit which perform pseudo-tuning.

Power-supply circuit 901 outputs a voltage in response to the combination of signals (tuning data) received from pads PAD1 and PAD2. The output from power-supply circuit 901 is referred to as an internal power-supply voltage Vref1.

Power-supply circuit 902 outputs a voltage in response to the combination of signals (tuning data) received from pads PAD1 and PAD2. The output from power-supply circuit 902 is referred to as an internal power-supply voltage Vref2.

The configuration of a power-supply circuit included in the conventional power-supply tuning circuit shown in FIG. 10 will be described with reference to FIG. 11. A power-supply circuit 950 shown in FIG. 11 corresponds either of the power-supply circuits 901 and 902 shown in FIG. 10.

Power-supply circuit 950 shown in FIG. 11 includes NMOS transistors 26 and 27, PMOS transistors 21, 22, and 23, and fuses 24 and 25.

Each of the PMOS transistors 21, 22, and 23 is a transistor having a specific resistance value. PMOS transistors 21, 22, and 23 are connected in series between an external power-supply voltage extVCC and a ground potential GND, and the gate electrode of each transistor is connected to ground potential GND.

NMOS transistor 26 and fuse 24 are connected in series between one conductive terminal and the other conductive terminal of PMOS transistor 21. NMOS transistor 27 and fuse 25 are connected in series between one conductive terminal and the other conductive terminal of PMOS transistor 22.

A pseudo-tuning data input node 2a receives an output from NAND circuit 921 shown in FIG. 10. A pseudo-tuning data input node 2b receives an output from NAND circuit 922 shown in FIG. 10.

The gate electrode of NMOS transistor 26 is connected to pseudo-tuning data input node 2a. The gate electrode of NMOS transistor 27 is connected to pseudo-tuning data input node 2b.

An internal power-supply voltage Vref (corresponding to Vref1 or Vref2 in FIG. 10) is output from a node 2c connecting PMOS transistors 22 and 23. The value of internal power-supply voltage Vref is determined by the ratio of the resistance value between node 2c and ground potential GND with respect to the resistance value between node 2c and external power-supply voltage extVCC.

In the configuration shown in FIG. 11, the resistance value between node 2c and the external power-supply voltage can be selected from four levels by switching on/off each of the NMOS transistors 26 and 27 (or fuses 24 and 25).

In the pseudo-tuning mode (where pseudo-tuning on signal TUNE is activated), each of the NMOS transistors 26 and 27 is switched on/off based on a tuning signal while a fuse is constantly kept ON (fuse is in the connected state). Thus, the states in which the fuse is ON/OFF (connected/disconnected) are emulated. From observed result using a tester, an optimal tuning data (referred to as a tuning code) is determined.

When the internal power-supply voltage is specified for a finished product, NMOS transistors 26 and 27 are kept ON constantly, and fuse 24 or 25 is selectively blown (ON/OFF) by a laser trimmer based on the determined tuning code.

In a conventional power-supply tuning circuit, the same plurality of pads are used to perform pseudo-tuning for a plurality of power-supply circuits, as shown in FIG. 10 and FIG. 11. It is therefore impossible to perform pseudo-tuning simultaneously for a plurality of power-supply circuits.

Consequently, in the conventional pseudo-tuning mode in a wafer test, pseudo-tuning is required for each power-supply circuit in order to determine the optimal tuning code corresponding to each circuit.

In addition, conventionally, it is impossible to set the optimal tuning code for each of the power-supply circuits at the same time. Therefore, in the wafer test, the internal power-supply voltage used is adjusted by applying it from outside.

Moreover, in a conventional power-supply tuning circuit, since the power-supply circuit does not have the current drivability, it is necessary, for example, to tune, to a higher potential, the potential (logic low or "L" level) inappropriate to be monitored from outside.

SUMMARY OF THE INVENTION

Thus, the present invention provides a semiconductor integrated circuit device which is capable of performing simultaneous pseudo-tuning for a plurality of power-supply circuits.

Moreover, the present invention provides a semiconductor integrated circuit device which can pseudo-tune without the use of a plurality of pads.

Furthermore, the present invention provides a semiconductor integrated circuit device which is capable of performing accurate pseudo-tuning with ease.

The semiconductor integrated circuit device according to an aspect is provided with a plurality of power-supply generation circuits, each including a fuse for generating a desired internal voltage when being blown, a latch circuit for latching tuning data for performing pseudo-tuning, and an emulation circuit for emulating, in response to the data latched by the latch circuit, a blow state of the fuse to emulate outputting of the internal voltage, and a plurality of supply control circuits being disposed corresponding to the plurality of power-supply generation circuits respectively and each controlling supplying of the tuning data to the corresponding power-supply generation circuit.

Thus, one advantage of the present invention is that simultaneous pseudo-tuning for a plurality of power-supply circuits becomes possible with a latch circuit for latching the data for pseudo-tuning provided for each of the plurality of power-supply circuits.

In addition, each power-supply circuit can generate an internal power-supply voltage using the latched data. Therefore, it becomes possible to perform the wafer test using the generated internal power-supply voltage (without applying a voltage from outside).

Particularly, tuning data is automatically generated internally, thus facilitating execution of the test programs. Moreover, since the external pad for applying the tuning data is no longer needed, the chip area can be reduced.

Particularly automatic pseudo-tuning becomes possible when the power-supply tuning circuit enters the test mode.

The tuning code required for generating an appropriate potential is generated internally. Thus, execution of the test programs is facilitated.

Particularly, individual application of the tuning data to a power-supply circuit becomes possible using a power-supply selection transistor.

Particularly, pseudo-tuning becomes possible using a transistor.

Particularly, a fuse blow becomes possible using the data latched by a latch circuit. Thus, a fuse may be blown during the wafer test, reducing the blow time as a result.

The semiconductor integrated circuit device in accordance with the present invention is provided with a power-supply generation circuit including a test mode designating circuit (a circuit for designating a test mode) for detecting the designation of a test mode in response to a test mode designating signal (a signal for designating a test mode) input from outside, a data generation circuit for successively generating tuning data to perform pseudo-tuning in the test mode, a fuse for generating a desired internal voltage when being blown, and an emulation circuit for emulating a blow state of the fuse to emulate outputting the internal voltage.

Another advantage of the present invention is that it becomes possible to perform pseudo-tuning in a test mode by providing a circuit which generates tuning data upon entering the test mode. In addition, since the external pad for applying tuning data is no longer required, the chip area can be reduced.

Particularly, the tuning data is generated by a counter and a ring oscillator which oscillates in the test mode. Thus, the successive generation of tuning data becomes possible in the test mode.

Particularly, since the ring oscillator is also used for self-refresh mode, the chip area can be reduced.

Particularly, a comparator, in particular a current mirror type differential amplifier, for comparing a generated internal power-supply voltage with an appropriate potential is provided. Thus, even when tuning a potential level particularly inappropriate to be monitored ("L" level), the tuning state can be monitored by differentially amplifying the difference between the appropriate potential and the "L" level potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The power-supply tuning circuit according to the first embodiment of the present invention will be described below. The power-supply tuning circuit according to the first embodiment of the present invention has a plurality of power-supply circuits and can simultaneously perform pseudo-tuning for each of the plurality of power-supply circuits.

Figure 1:
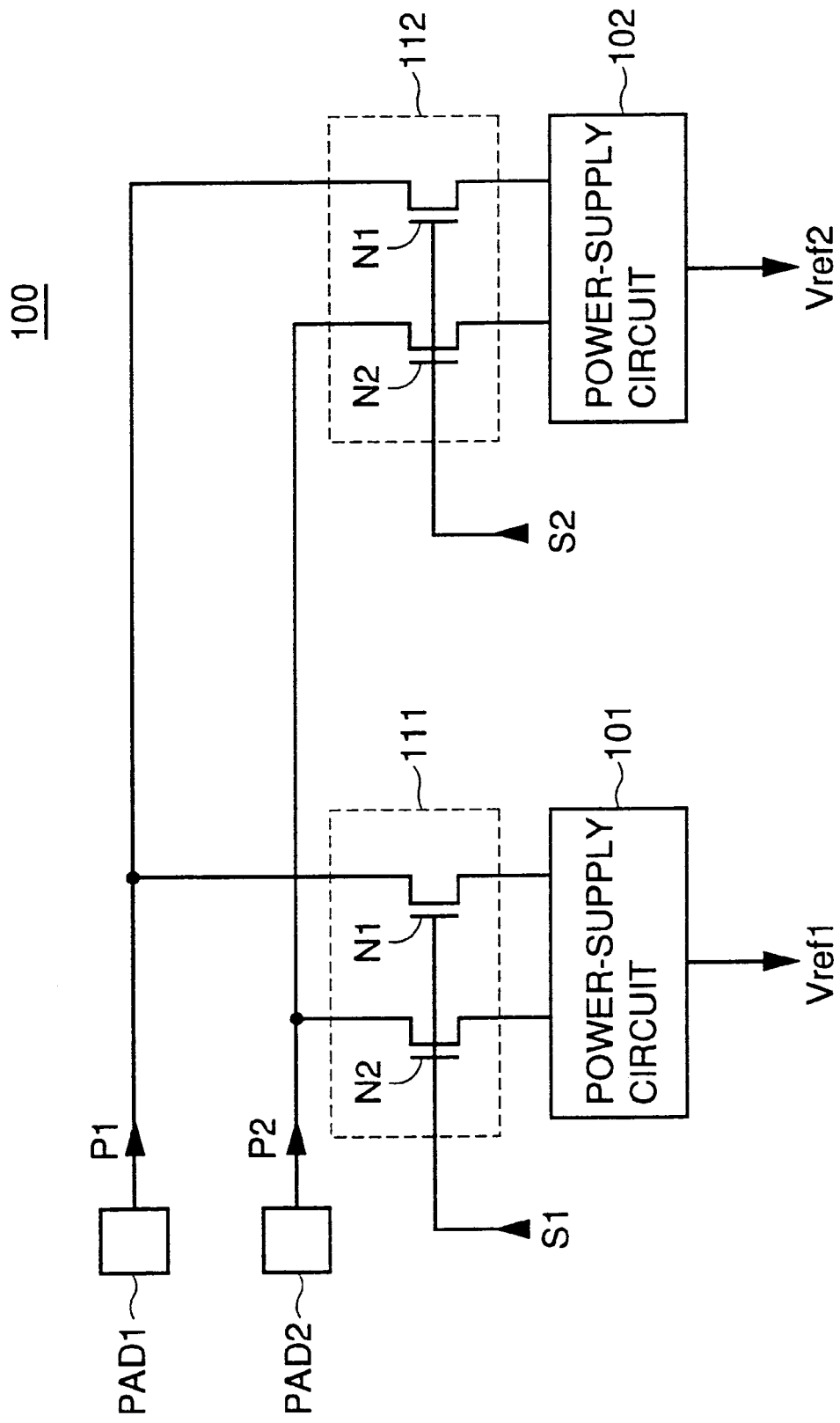
FIG. 1 is a diagram showing an example of an overall configuration of a power-supply tuning circuit 100 according to the first embodiment of the present invention.
Figure 2:
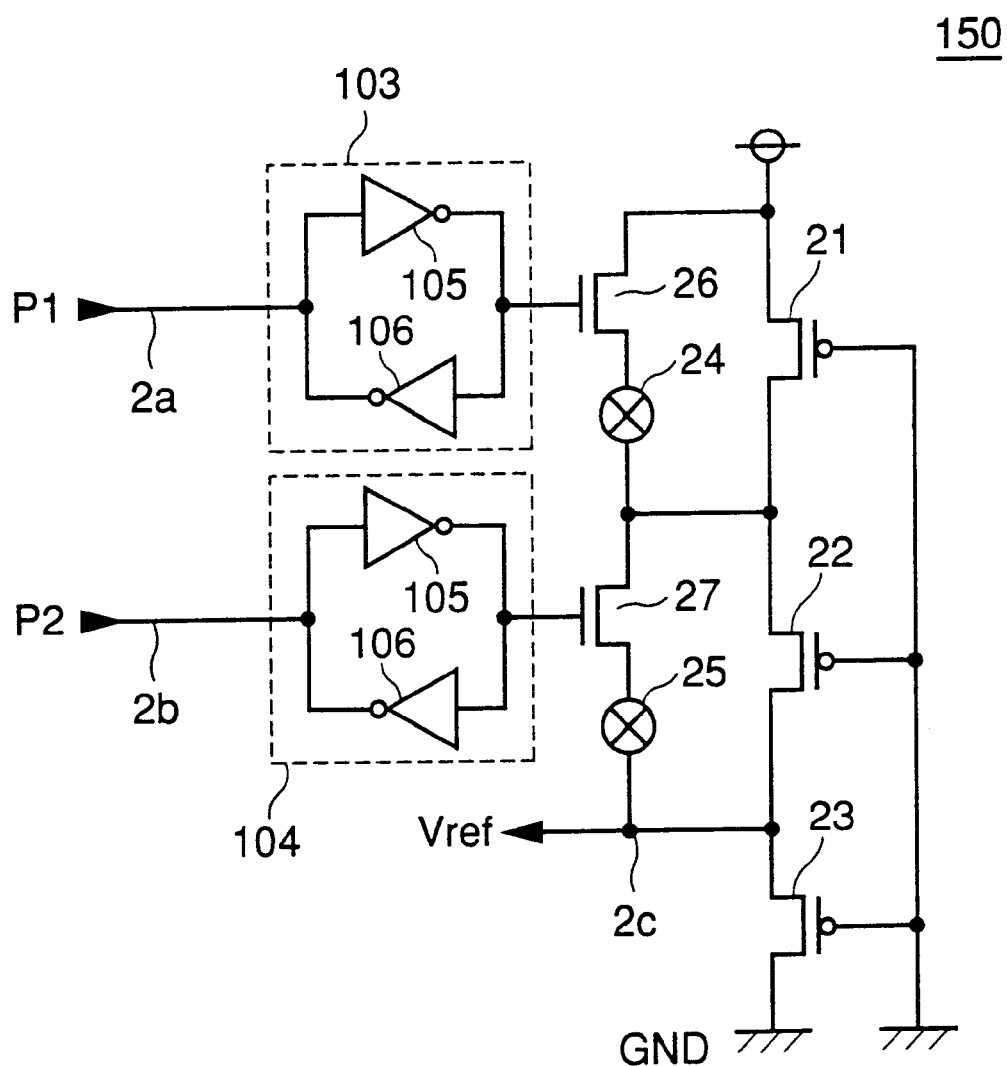
FIG. 2 is a circuit diagram showing an example of a specific configuration of a power-supply circuit according to the first embodiment of the present invention shown in FIG. 1.

A power-supply tuning circuit 100 according to the first embodiment of the invention will be described in relation to FIG. 1 and FIG. 2. FIG. 1 is a diagram showing an example of an overall configuration of power-supply tuning circuit 100 according to the first embodiment of the invention, and FIG. 2 is a circuit diagram showing an example of a specific configuration of a power-supply circuit shown in FIG. 1. FIG. 1 shows as an example a configuration in which an internal power-supply voltage is generated using external pads PAD1 and PAD2.

Power-supply tuning circuit 100 shown in FIG. 1 includes a plurality of power-supply circuits and a plurality of switching circuits. Power-supply circuits 101 and 102 and switching circuits 111 and 112 are illustrated in FIG. 1 as typical examples.

Switching circuits 111 and 112 each include power-supply selection transistors N1 and N2. Power-supply selection transistors N1 and N2 in switching circuit 111 switch on/off in response to a control signal S1. Power-supply selection transistors N1 and N2 in switching circuit 112 switch on/off in response to a control signal S2.

A tuning signal P1 is applied from pad PAD1. A tuning signal P2 is applied from pad PAD2.

Switching circuit 111 supplies tuning data (tuning signals P1 and P2) to the corresponding power-supply circuit 101 in response to control signal S1. Switching circuit 112 supplies tuning data (tuning signals P1 and P2) to the corresponding power-supply circuit 102 in response to control signal S2.

Power-supply circuit 101 includes a latch circuit as will be described later, and outputs a voltage in response to the latched tuning data. The output of power-supply circuit 101 is referred to as an internal power-supply voltage Vref1.

Power-supply circuit 102 includes a latch circuit as will be described later, and outputs a voltage in response to the latched tuning data. The output of power-supply circuit 102 is referred to as an internal power-supply voltage Vref2.

The configuration of a power-supply circuit 150 shown in FIG. 2 corresponds to power-supply circuits 101 and 102 shown in FIG. 1. The same reference characters are used for the same components as those in the conventional power-supply circuit 950 shown in FIG. 11, and the description thereof will not be repeated.

Power-supply circuit 150 shown in FIG. 2 differs from the configuration of the conventional power-supply circuit 950 in that the former is provided with a latch circuit. The configuration shown in FIG. 2 is provided with a latch circuit 103 corresponding to a pseudo-tuning data input node 2a and a latch circuit 104 corresponding to a pseudo-tuning data input node 2b, respectively. Each of latch circuits 103 and 104 includes inverters 105 and 106.

Latch circuit 103 holds tuning signal PI received from pseudo-tuning data input node 2a. Latch circuit 104 holds tuning signal P2 received from pseudo-tuning data input node 2b.

The gate electrode of an NMOS transistor 26 is connected to the corresponding latch circuit 103. The gate electrode of an NMOS transistor 27 is connected to the corresponding latch circuit 104.

Now, pseudo-tuning operation will be described. Corresponding power-supply selection transistors N1 and N2 are turned on to supply tuning data to a corresponding latch circuit. Subsequently, power-supply selection transistors N1 and N2 are turned off. Then, corresponding power-supply selection transistors N1 and N2 are turned on to supply other tuning data is supplied to a corresponding latch circuit.

From repetition of the above-described operation, it becomes possible to perform pseudo-tuning in another power-supply circuit before pseudo-tuning in one power-supply circuit is completed.

Therefore, the test (pseudo-tuning) step can be shortened in fabricating a semiconductor integrated circuit device. Moreover, with a latch circuit, the optimal data required for tuning can be retained. Consequently, a wafer test may be performed using a generated internal power-supply voltage without an appropriate voltage applied from outside.

Second Embodiment

The power-supply tuning circuit according to the second embodiment of the present invention will be described below. The power-supply tuning circuit according to the second embodiment of the invention is capable of generating an optimal tuning code within the device.

Figure 3:
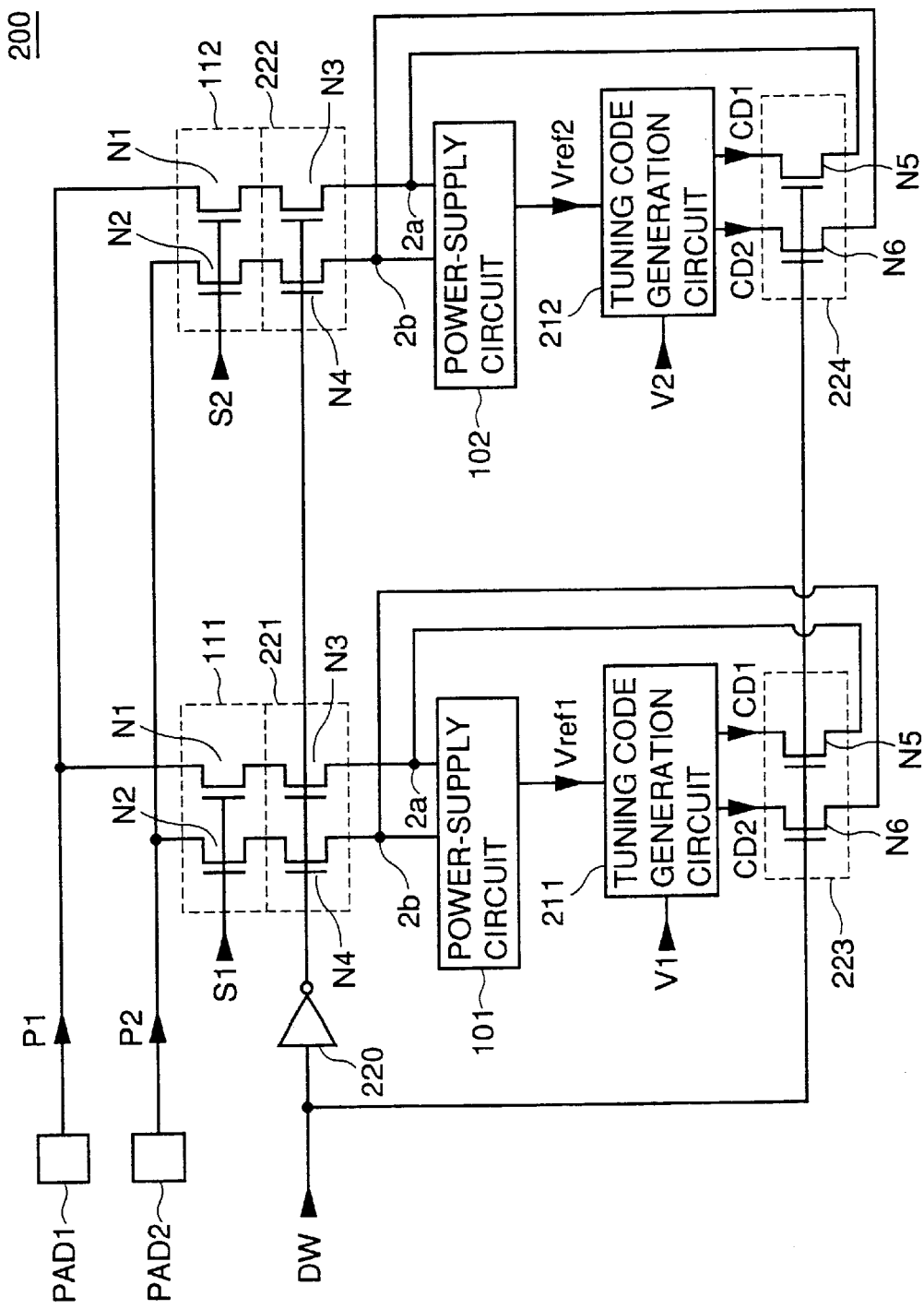
FIG. 3 is a diagram showing an example of an overall configuration of a power-supply tuning circuit 200 according to the second embodiment of the present invention.

The configuration of a power-supply tuning circuit 200 according to the second embodiment of the invention will be described with reference to FIG. 3. FIG. 3 shows as an example a configuration in which an internal power-supply voltage is generated using two pads PAD1 and PAD2. The same reference characters are used for the same components as those in power-supply tuning circuit 100 shown in FIG. 1, and the description thereof will not be repeated. Power-supply tuning circuit 200 shown in FIG. 3 is provided with power-supply circuits 101 and 102, switching circuits 111 and 112, tuning code generation circuits 211 and 212, and switching circuits 221, 222, 223, and 224 for tuning code.

Tuning code generation circuit 211 is disposed corresponding to power-supply circuit 101. Tuning code generation circuit 212 is disposed corresponding to power-supply circuit 102.

Tuning code generation circuit 211 generates optimal tuning codes CD1 and CD2 based on internal power-supply voltage Vref1 output from the corresponding power-supply circuit 101 and on an appropriate potential V1 applied from outside.

Tuning code generation circuit 212 generates optimal tuning codes CD1 and CD2 based on internal power-supply voltage Vref2 output from the corresponding power-supply circuit 102 and on an appropriate potential V2 applied from outside.

Switching circuits 221 and 223 are disposed corresponding to power-supply circuit 101. Switching circuits 222 and 224 are disposed corresponding to power-supply circuit 102.

Switching circuits 223 and 224 each include control transistors N5 and N6. Control transistors N5 and N6 is disposed between an output node of the corresponding tuning code generation circuit and the corresponding pseudo-tuning data input node 2a. Control transistor N6 is disposed between an output node of the corresponding tuning code generation circuit and the corresponding pseudo-tuning data input node 2b. Control transistors N5 and N6 switch on/off in response to a switching control signal DW. Switching control signal DW may be applied directly from outside.

An inverter 220 inverts switching control signal DW and outputs a switching control signal /DW. Switching circuits 221 and 222 each include control transistors N3 and N4. Control transistor N3 is disposed between a power-supply selection transistor N1 and pseudo-tuning data input node 2a. Control transistor N4 is disposed between a power-supply selection transistor N2 and pseudo-tuning data input node 2b. Control transistors N3 and N4 switch on/off in response to switching control signal /DW received via inverter 220.

Tuning codes CD1 and CD2 output from tuning code generation circuit 211 are held in a latch circuit included in power-supply circuit 101 based on switching control signal DW.

Tuning codes CD1 and CD2 output from tuning code generation circuit 212 are held in a latch circuit included in power-supply circuit 102 based on switching control signal DW.

Figure 4:
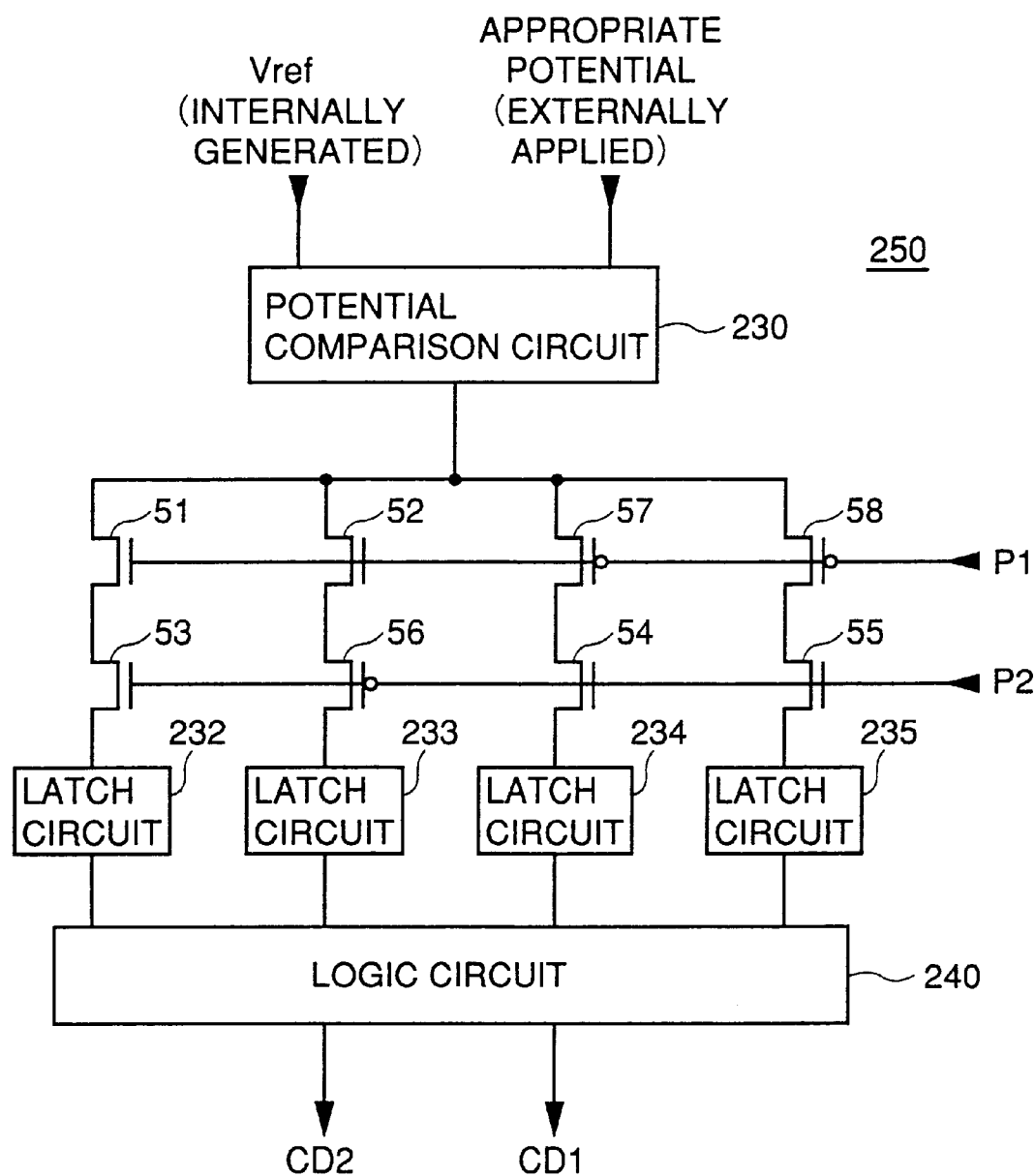
FIG. 4 is a diagram showing an example of a specific configuration of a tuning code generation circuit shown in FIG. 3.

An example of a specific configuration of tuning code generation circuits 211 and 212 shown in FIG. 3 is now described in relation to FIG. 4. A tuning code generation circuit 250 shown in FIG. 4 corresponds to either of the tuning code generation circuits 211 and 212 shown in FIG. 3.

Tuning code generation circuit 250 shown in FIG. 4 is provided with a potential comparison circuit 230, latch circuits 232, 233, 234, and 235, a logic circuit 240, NMOS transistors 51, 52, 53, 54, and 55, and PMOS transistors 56, 57, and 58.

Potential comparison circuit 230 receives at its inputs an appropriate potential (V1 or V2 in FIG. 3) applied from outside and an internal power-supply voltage Vref (Vref1 or Vref2 in FIG. 3) and makes a comparison between them.

NMOS transistors 51 and 53 are connected in series between the output node of potential comparison circuit 230 and latch circuit 232. NMOS transistor 52 and PMOS transistor 56 are connected in series between the output node of potential comparison circuit 230 and latch circuit 233. PMOS transistor 57 and NMOS transistor 54 are connected in series between the output node of potential comparison circuit 230 and latch circuit 234. PMOS transistor 58 and NMOS transistor 55 are connected in series between the output node of potential comparison circuit 230 and latch circuit 235.

The respective gate electrodes of NMOS transistors 51 and 52 and PMOS transistors 57 and 58 receive a tuning signal P1. The respective gate electrodes of NMOS transistors 53, 54 and 55 and PMOS transistor 56 receive a tuning signal P2.

Output nodes of latch circuits 232, 233, 234, and 235 are connected to logic circuit 240. Tuning codes CD1 and CD2 are output from logic circuit 240.

The pseudo-tuning operation will be described below. The power-supply circuit outputs internal power-supply voltage Vref in response to the tuning data input from outside. Tuning code generation circuit 250 uses potential comparison circuit 230 to compare the generated internal power-supply voltage Vref with an appropriate potential applied from outside.

The result of the comparison is held in one of the latch circuits 232, 233, 234 and 235 according to the level ("H" level, "L" level) of each of the tuning signals P1 and P2. Logic circuit 240 generates tuning codes CD1 and CD2 required for generating the appropriate potential based on the recorded result.

Control transistors N3, N4, N5, and N6 each are switched on when an "H" level switching control signal DW is applied from outside. As a result, tuning codes CD1 and CD2 respectively generated from tuning code generation circuits 211 and 212 are applied to the corresponding pseudo-tuning data input nodes 2a and 2b, respectively. Consequently, the power-supply circuit records the tuning code best suited for the latch circuit provided inside.

Such configuration enables the generation of an optimal tuning code, conventionally generated using an external tester, within the device. As a result, execution of test programs during a wafer test is facilitated.

Third Embodiment

The semiconductor integrated circuit device according to the third embodiment of the present invention will now be described. With the semiconductor integrated circuit device according to the third embodiment of the invention, it becomes possible to perform automatic pseudo-tuning when the power-supply tuning circuit enters a test mode.

Figure 5:
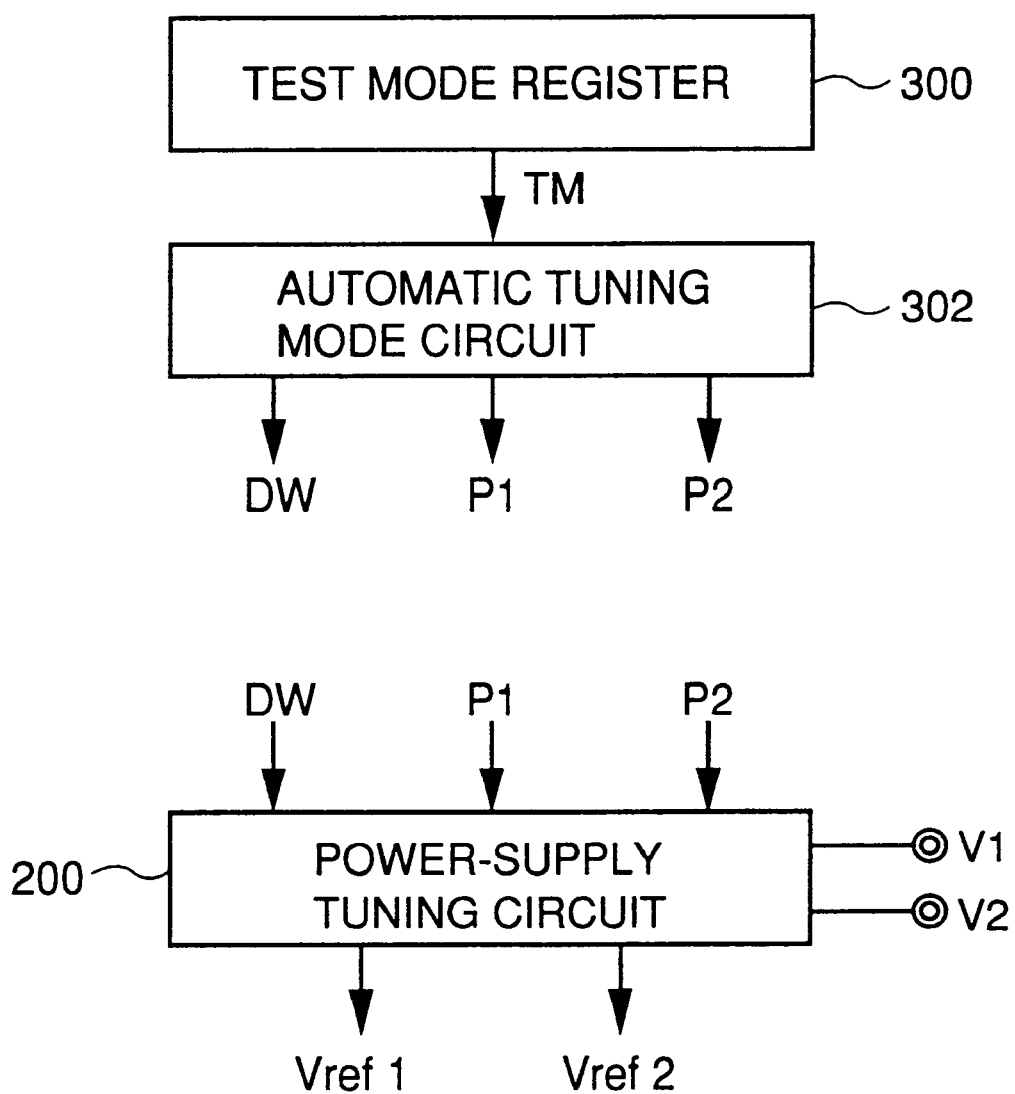
FIG. 5 is a block diagram showing an example of a configuration of the main portion of a semiconductor integrated circuit device 1000 according to the third embodiment of the present invention.

The configuration of the semiconductor integrated circuit device according to the third embodiment of the invention is described in relation to FIG. 5.

A semiconductor integrated circuit device 1000 shown in FIG. 5 is provided with a test mode register 300, an automatic tuning mode circuit 302, and a power-supply tuning circuit 200.

Test mode register 300 detects the designation of a test mode in response to an external signal (for example, an address signal) and outputs a test mode signal TM as the result of detection.

Automatic tuning mode circuit 302 includes a counter inside (not shown). The counter included in automatic tuning mode circuit 302 generates switching control signal DW, tuning signal P1, and tuning signal P2 in response to test mode signal TM.

Power-supply tuning circuit 200 according to the third embodiment of the invention is different from the second embodiment of the invention in that the former receives switching control signal DW, tuning signal P1, and tuning signal P2 generated inside.

With such configuration, it is possible to pseudo-tune to an appropriate potential by having appropriate potentials V1 and V2 applied from outside and by having the power-supply circuit simply enter a test mode. Thus, the test programs in the wafer test are easily executed.

In addition, in a configuration in which the tuning data is applied using external pads, more external pads are required in order to perform more accurate tuning. These external pads, however, are only used for pseudo-tuning, causing the problem of increased chip area. On the other hand, the configuration according to the third embodiment of the present invention does not require even one external pad for applying tuning data. Consequently, the chip area can be reduced.

Moreover, automatic tuning mode circuit 302 is also applicable to power-supply tuning circuit 100 shown in FIG. 1. In this case, power-supply tuning circuit 100 receives tuning signal P1 and tuning signal P2 from automatic tuning mode circuit 302 instead of from the external pad.

Fourth Embodiment

The power-supply circuit according to the fourth embodiment of the present invention will be described below. With the power-supply circuit according to the fourth embodiment of the invention, a fuse can be electrically blown using data held in a latch circuit.

The configuration of the power-supply circuit according to the fourth embodiment of the present invention is described with reference to FIG. 6. As an example, a configuration in which two latch circuits are used is shown in FIG. 6.

Figure 6:
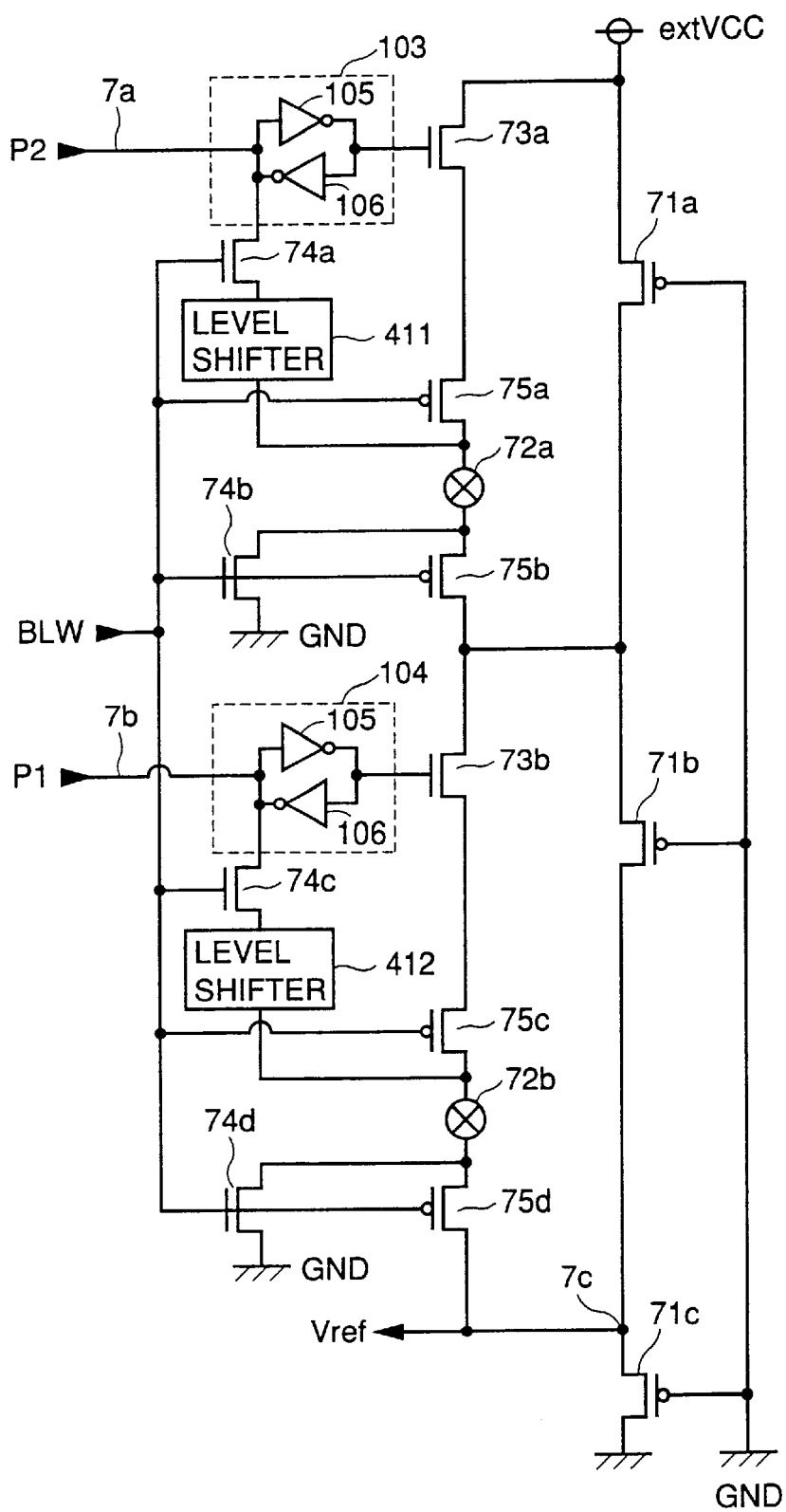
FIG. 6 is a circuit diagram showing an example of a specific configuration of a power-supply circuit 400 according to the fourth embodiment of the present invention.

A power-supply circuit 400 shown in FIG. 6 includes NMOS transistors 73a and 73b, PMOS transistors 71a, 71b, 71c, 75a, 75b, 75c, and 75d, and fuses 72a and 72b.

Each of the PMOS transistors 71a, 71b, and 71c is a transistor having a specific resistance value. PMOS transistors 71a, 71b, and 71c are connected in series between an external power-supply voltage extVCC and a ground potential GND, and the gate electrode of each transistor is connected to ground potential GND.

NMOS transistor 73a, PMOS transistor 75a, fuse 72a, and PMOS transistor 75b are connected in series between one conductive terminal and the other conductive terminal of PMOS transistor 71a.

NMOS transistor 73b, PMOS transistor 75c, fuse 72b, and PMOS transistor 75d are connected in series between one conductive terminal and the other conductive terminal of PMOS transistor 71b.

NMOS transistors 75a, 75b, 75c, and 75d are transistors for fuse blow. The respective gate electrodes of NMOS transistors 75a, 75b, 75c and 75d receive a fuse blow signal BLW. Fuse blow signal BLW is a signal for designating fuse blow, and may be applied directly from outside.

An internal power-supply voltage Vref is output from a node 7c connecting PMOS transistors 71b and 71c. The value of internal power-supply voltage Vref is determined by the ratio of the resistance value between node 7c and ground potential GND with respect to the resistance value between node 7c and external power-supply voltage extVCC.

Power-supply circuit 400 shown in FIG. 6 further includes latch circuits 103 and 104, NMOS transistors 74a, 74b, 74c and 74d, and level shifters 411 and 412. Latch circuits 103 and 104 each include inverters 105 and 106.

Latch circuit 103 holds a tuning signal P1 received from a pseudo-tuning data input node 7a. Latch circuit 104 holds a tuning signal P2 received from a pseudo-tuning data input node 7b.

The gate electrode of NMOS transistor 73a is connected to latch circuit 103. The gate electrode of NMOS transistor 73b is connected to latch circuit 104.

NMOS transistors 74a, 74b, 74c, and 74d are transistors for fuse blow. NMOS transistor 74a is connected between latch circuit 103 and level shifter 411. NMOS transistor 74c is connected between latch circuit 104 and level shifter 412. The respective gate electrodes of NMOS transistors 74a and 74c receive a fuse blow signal BLW.

One conductive terminal of NMOS transistor 74b is connected to a node connecting fuse 72a and PMOS transistor 75b, and the other conductive terminal is connected to ground potential GND. One conductive terminal of NMOS transistor 74d is connected to a node connecting fuse 72b and PMOS transistor 75d, while the other conductive terminal is connected to ground potential GND. The respective gate electrodes of NMOS transistors 74b and 74d receive fuse blow signal BLW.

Level shifter 411 has its input node connected to NMOS transistor 74a and its output node connected to a node connecting PMOS transistor 75a and fuse 72a. Level shifter 412 has its input node connected to NMOS transistor 74c and its output node connected to a node connecting PMOS transistor 75c and fuse 72b.

Now, the operation of power-supply circuit 400 as shown in FIG. 6 will be described. Tuning data is applied to power-supply circuit 400. The tuning data is recorded in a latch circuit. In this state, when an "H" level fuse blow signal BLW is applied, NMOS transistors 74a–74d are switched on, and PMOS transistors 75a–75d are switched off.

As a result, fuse 72a has one terminal connected to ground potential GND and the other terminal connected to latch circuit 103 via level shifter 411. Fuse 72b has one terminal connected to ground potential GND and the other terminal connected to latch circuit 104 via level shifter 412.

When the data latched by latch circuit 103 is of "H" level, a voltage raised high enough by level shifter 411 is applied to fuse 72a. Consequently, fuse 72a is blown electrically. When the data latched by latch circuit 104 is of "H" level, a voltage raised high enough by level shifter 412 is applied to fuse 72b. As a result, fuse 72b is blown electrically.

Thus, tuning can be completed in a wafer test and the blow time can be shortened.

Moreover, power-supply circuit 400 is applicable to power-supply tuning circuit 200 shown in FIG. 3 or FIG. 5. In this case, a fuse is blown electrically based on a tuning code generated by a tuning code generation circuit.

Fifth Embodiment

The semiconductor integrated circuit device according to the fifth embodiment of the present invention will be described. With the semiconductor integrated circuit device according to the fifth embodiment of the invention, accurate pseudo-tuning can be performed without an external pad.

The configuration of the semiconductor integrated circuit device according to the fifth embodiment of the invention will be described with reference to FIG. 7.

Figure 7:
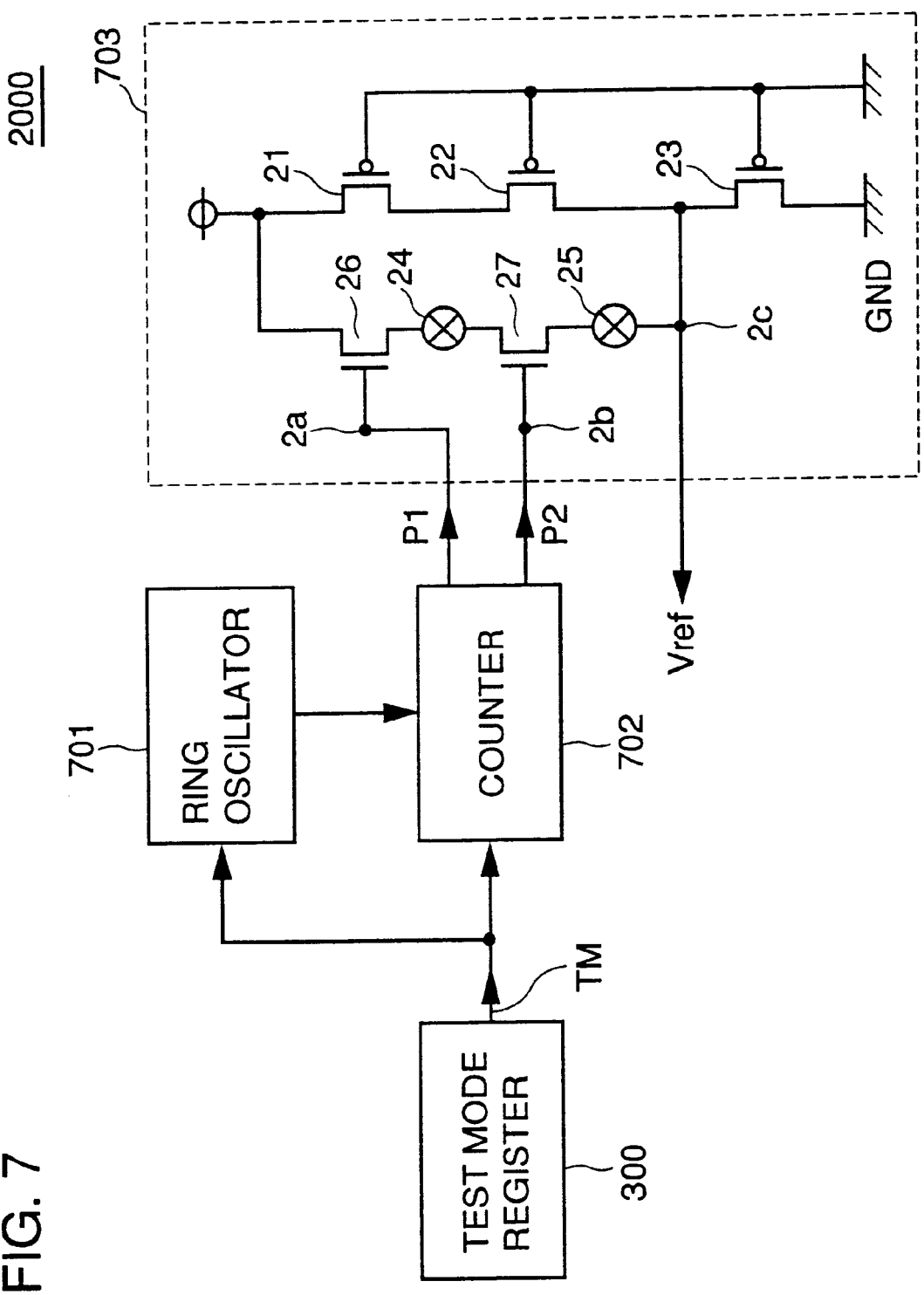
FIG. 7 is a diagram showing an example of a configuration of the main portion of a semiconductor integrated circuit device 2000 according to the fifth embodiment of the present invention.

A semiconductor integrated circuit device 2000 shown in FIG. 7 is provided with a test mode register 300, a ring oscillator 701, a counter 702, and a power-supply circuit 703.

Test mode register 300 detects the designation of a test mode in response to an external signal (for example, an address signal) and outputs a test mode signal TM as the result of detection.

Ring oscillator 701 operates in response to test mode signal TM output from test mode register 300. Counter 702 receives the output from ring oscillator 701, performs a count-up operation, and outputs count values P1 and P2. Counter 702 is reset at the same time as or prior to the activation of test mode signal TM.

Figure 11:
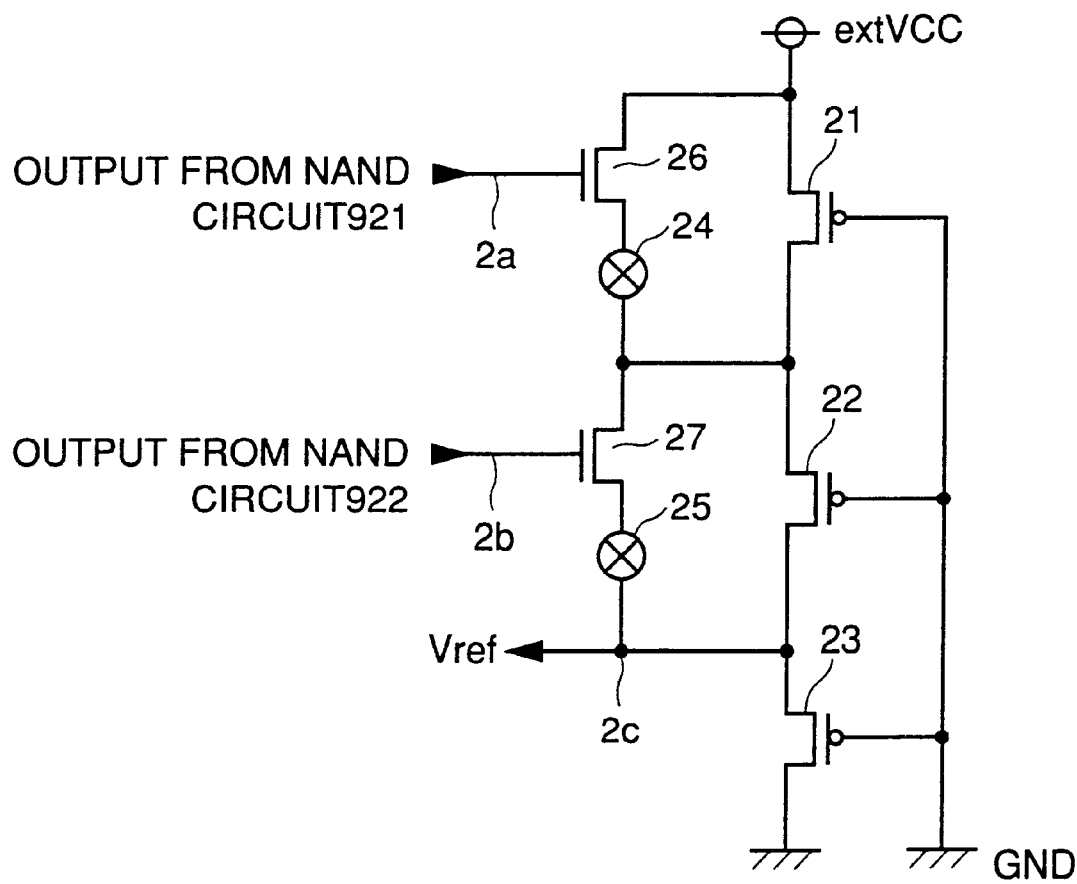
FIG. 11 is a circuit diagram showing a configuration of a power-supply circuit in the conventional power-supply tuning circuit 900 shown in FIG. 10.

Power-supply circuit 703 shown in FIG. 7 is of the same configuration as the conventional power-supply circuit 950 described in relation to FIG. 11. Power-supply circuit 703 shown in FIG. 7 differs from the conventional power-supply circuit 950 in that pseudo-tuning data input node 2a of the former receives an output (designated by P1) from counter 702 and that pseudo-tuning data input node 2b receives an output (designated by P2) from counter 702.

Outputs P1 and P2 of counter 702 include four types of combinations. More specifically, P1 and P2 take one of the following sets of values: "(0, 0)," "(0, 1)," "(1, 0)," and "(1, 1)".

Tuning data, that is, the combination of outputs P1 and P2, is applied to power-supply circuit 703. Power-supply circuit 703 pseudo-tunes using the tuning data. Such configuration enables pseudo-tuning without using an external pad.

Moreover, ring oscillator 701 is also used for self-refresh mode. In this case, the chip area can be reduced.

Sixth Embodiment

Figure 8:
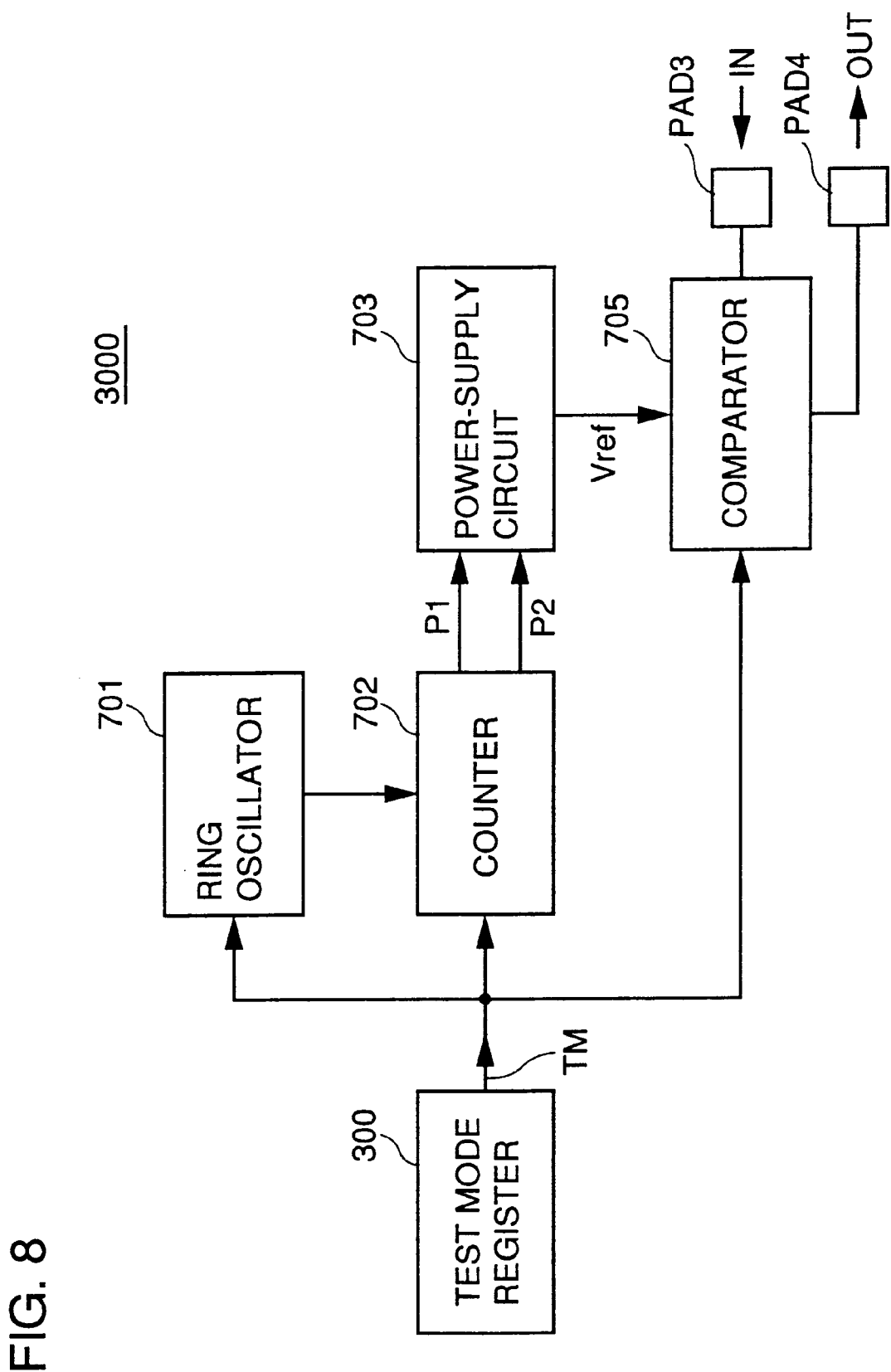
FIG. 8 is a block diagram showing an example of a configuration of the main portion of a semiconductor integrated circuit device 3000 according to the sixth embodiment of the present invention.
Figure 9:
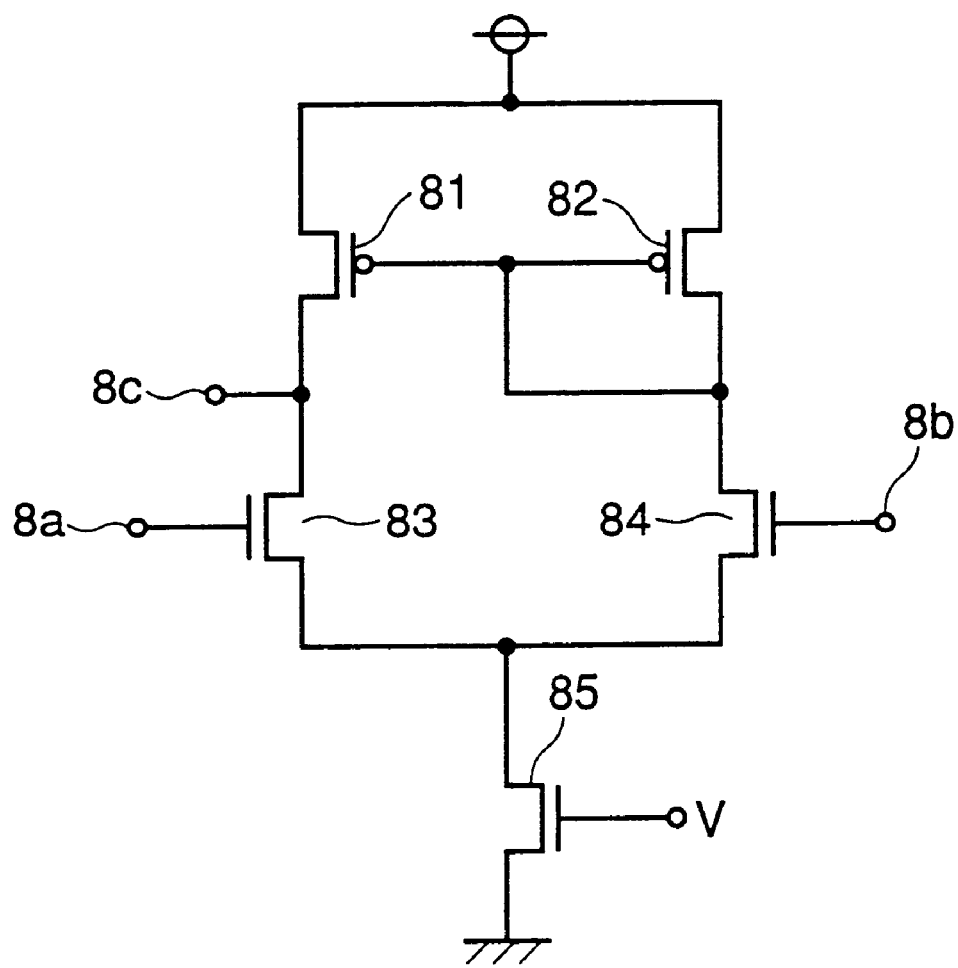
FIG. 9 is a circuit diagram showing an example of a configuration of a comparator according to the sixth embodiment of the present invention shown in FIG. 8.
Figure 10:
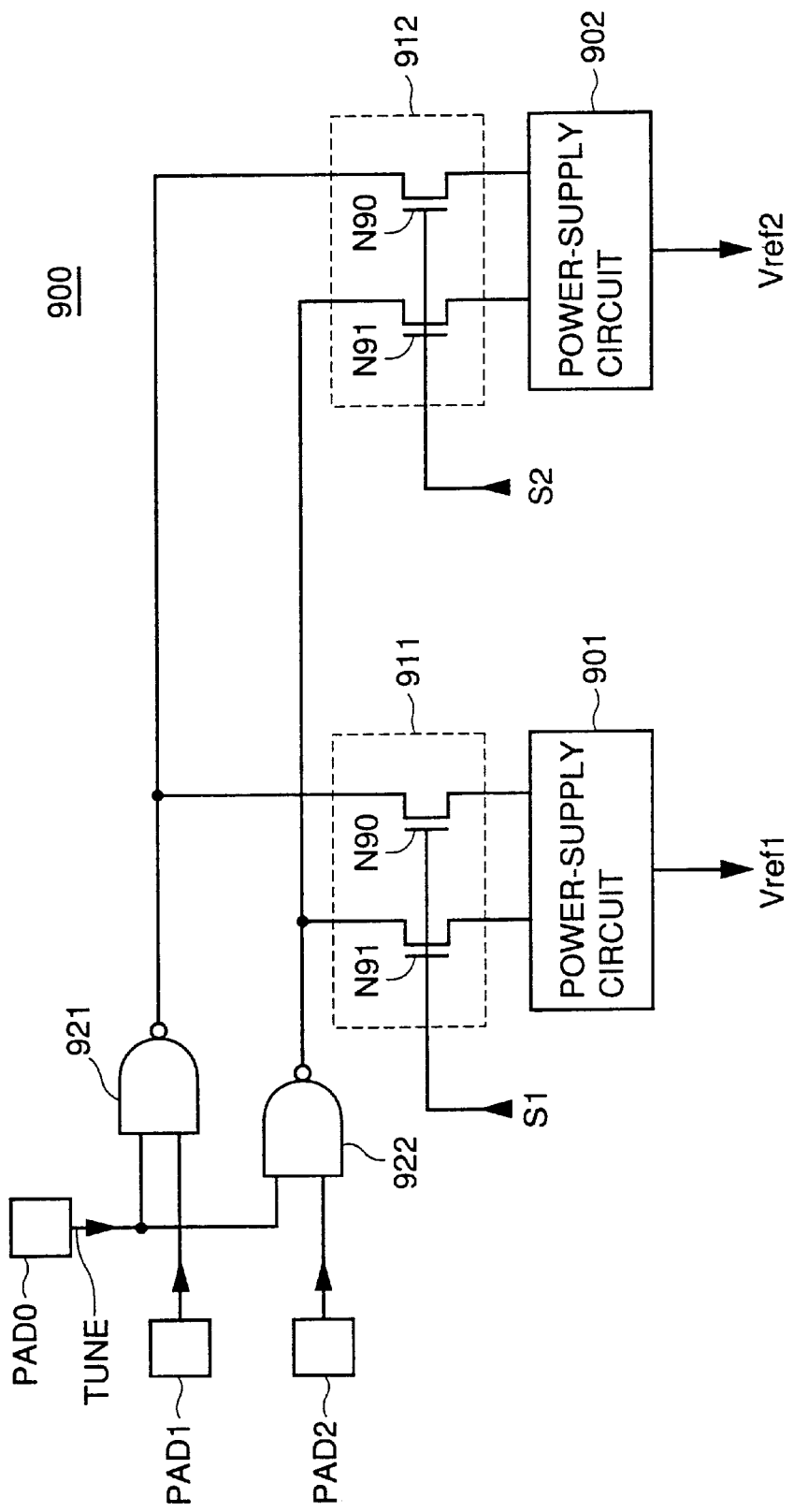
FIG. 10 is a diagram showing an overall configuration of a conventional power-supply tuning circuit 900.

The semiconductor integrated circuit device according to the sixth embodiment of the present invention will be described in relation to FIGS. 8 and 9. FIG. 8 is a block diagram showing an example of a configuration of the main portion of a semiconductor integrated circuit device 3000 according to the sixth embodiment of the invention, and FIG. 9 is a circuit diagram showing an example of a configuration of a comparator according to the sixth embodiment of the invention shown in FIG. 8. In the following description, the same reference characters are used for the same components as those in semiconductor integrated circuit device 2000 shown in FIG. 7, and the description thereof will not be repeated.

Semiconductor integrated circuit device 300 according to the sixth embodiment of the invention further includes a comparator 705 in addition to the configuration of semiconductor integrated circuit device 2000 shown in FIG. 7. Comparator 705 is configured, for example, by a current mirror type differential amplifier 800 shown in FIG. 9.

Current mirror type differential amplifier 800 shown in FIG. 9 includes PMOS transistors 81 and 82, and NMOS transistors 83, 84, and 85.

Current mirror type differential amplifier 800 has two input nodes 8a and 8b. Input node 8a is connected to the gate electrode of NMOS transistor 83. Input node 8b is connected to the gate electrode of NMOS transistor 84.

An appropriate potential is input to one input node 8a (or 8b). An internal power-supply voltage Vref generated in power-supply circuit 703 is input to the other input node 8b (or 8a). The result of the comparison is output from a node 8c which connects PMOS transistor 81 and NMOS transistor 83.

Current mirror type differential amplifier 800 is operated by applying an "H" level signal V to the gate electrode of NMOS transistor 85 according to test mode signal TM.

Referring to FIG. 8, an appropriate potential IN is applied from a pad PAD3. A signal OUT which is the result of the comparison is output from a pad PAD4. For instance, when internal power-supply voltage Vref is lower than the desired appropriate potential, "H" level (or "L" level) signal OUT is output, and when internal power-supply voltage Vref is higher than the desired appropriate potential, "L" level (or "H" level) signal OUT is output.

The boundary between "H" level and "L" level in signal OUT becomes the target tuning point. Therefore, pseudo-tuning can be accurately performed, particularly for a potential level inappropriate to be monitored from outside, based on the measured switching point between "L" level and "H" level in signal OUT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
a plurality of power-supply generation means, each including a fuse for generating a desired internal voltage when being blown, latch means for latching tuning data for performing pseudo-tuning, and emulation means for emulating, in response to the data latched by said latch means, a blow state of said fuse to emulate outputting of the internal voltage; and
a plurality of supply control means being disposed corresponding to said plurality of power-supply generation means respectively and each controlling supplying of said tuning data to a corresponding one of said power-supply generation means.

2. The semiconductor integrated circuit device according to claim 1, further comprising an automatic tuning means for generating said tuning data.

3. The semiconductor integrated circuit device according to claim 2, further comprising test mode designating means for detecting designation of a test mode in response to a test mode designating signal input from outside, wherein
said automatic tuning means generates said tuning data in said test mode.

4. The semiconductor integrated circuit device according to claim 1, further comprising:
a plurality of tuning code generation means disposed corresponding to said plurality of power-supply generation means respectively and for generating a tuning code for tuning an output of corresponding said emulation means to a desired appropriate potential; and
a plurality of supply switching means disposed corresponding to said plurality of power-supply generation means and for supplying corresponding said tuning code to corresponding said latch means, wherein
each of said plurality of tuning code generation means includes
comparison means for comparing said internal voltage output from corresponding said emulation means with corresponding said desired appropriate potential, and
code generation means for determining said tuning code so that an output of said emulation means matches said desired appropriate potential in response to a result of comparison of said comparison means.

5. The semiconductor integrated circuit device according to claim 4, further comprising:
test mode designating means for detecting designation of a test mode in response to a test mode designating signal output from outside; and
automatic tuning means for generating a switching control signal for controlling timing of operation of said plurality of supply switching means in said test mode.

6. The semiconductor integrated circuit device according to claim 1, further comprising:
a plurality of tuning code generation means disposed corresponding to said plurality of power-supply generation means respectively and for generating a tuning code for tuning an output of corresponding said emulation means to a desired appropriate potential;
a plurality of supply switching means disposed corresponding to said plurality of power-supply generation means and for supplying corresponding said tuning code to corresponding said latch means; and
automatic tuning means for generating said tuning data and for generating a switching control signal for controlling timing of operation of said plurality of supply switching means; wherein
each of said plurality of tuning code generation means includes
comparison means for comparing said internal voltage output from corresponding said emulation means with corresponding said desired appropriate potential, and
code generation means for determining said tuning code so that an output of said emulation means matches said desired appropriate potential in response to a result of comparison of said comparison means.

7. The semiconductor integrated circuit device according to claim 6, further comprising test mode designating means for detecting designation of a test mode in response to a test mode designating signal input from outside, wherein said automatic tuning means generates said tuning data and said switching control signal in said test mode.

8. The semiconductor integrated circuit device according to claim 1, wherein each of said plurality of supply switching means is configured by a power-supply selection transistor, and said tuning data supplied is successively input to corresponding said power-supply generation means by switching on/off said power-supply selection transistors.

9. The semiconductor integrated circuit device according to claim 8, wherein said emulation means is configured by a transistor, and said transistor emulates a blow state of corresponding said fuse when being switched on/off based on latch data of corresponding said latch means.

10. The semiconductor integrated circuit device according to claim 1, wherein each of said plurality of power supply generation means further includes blow means for blowing corresponding said fuse in response to latch data of corresponding said latch means.

11. The semiconductor integrated circuit device according to claim 10, wherein said blow means includes level shift means for shifting a level of latch data of corresponding said latch means in response to a fuse blow designating signal for designating fuse blow, and applying means for applying an output of said level shift means to corresponding said fuse in response to said fuse blow designating signal.

12. A semiconductor integrated circuit device, comprising:

power-supply generation means including test mode designating means for detecting designation of a test mode in response to a test mode designating signal input from outside, data generation means for successively generating tuning data to perform pseudo-tuning in said test mode, a fuse for generating a desired internal voltage when being blown, and emulation means for emulating a blow state of said fuse to emulate outputting of the internal voltage.

13. The semiconductor integrated circuit device according to claim 12, wherein said data generation means includes a ring oscillator operating under control of said test mode designating means, and counting means for counting an output of said oscillator to output said tuning data under control of said test mode designating means.

14. The semiconductor integrated circuit device according to claim 13, further comprising:

a plurality of memory cells; and means for detecting designation of a self-refresh mode in response to a self-refresh mode designating signal output from outside, wherein said ring oscillator becomes operative in said self-refresh mode, and said memory cells are successively selected in response to outputs of said ring oscillator.

15. The semiconductor integrated circuit device according to claim 12, further comprising comparison means for comparing an internal voltage output from said emulation means with an appropriate potential input from outside.

16. The semiconductor integrated circuit device according to claim 15, wherein said comparison means is configured by a current mirror type differential amplifier.

17. The semiconductor integrated circuit device according to claim 13, further comprising comparison means for comparing an internal voltage output from said emulation means with an appropriate potential input from outside.

18. The semiconductor integrated circuit device according to claim 17, wherein said comparison means is configured by a current mirror type differential amplifier.

19. A semiconductor integrated circuit device, comprising:

a first voltage generation circuit connected to a power supply line to which a first external voltage is provided for generating an internal voltage;

a comparing circuit for comparing a second external voltage with said internal voltage generated at an output node of said first voltage generation circuit;

a latch circuit for latching data according to an output from said comparing circuit; and a second voltage generation circuit connected between said power supply line and said output node and controlled by data latched by said latch circuit.

20. The semiconductor integrated circuit device according to claim 19, wherein said second voltage generation circuit includes a fuse.

21. A semiconductor device comprising:

a power-supply circuit, wherein said power-supply circuit includes:

a data holding circuit capable of holding a control signal; and a voltage generation circuit connected to a power supply line, down-converting a voltage at said power-supply line and outputting the down-converted voltage in response to an output of said data holding circuit.

22. The semiconductor device according to claim 21, further comprising a code generation circuit, wherein said code generation circuit includes:

a comparison circuit determining by comparison whether said down-converted voltage is a predetermined voltage or not; and a circuit controlling change of data in said data holding circuit in response to an output of said comparison circuit.

23. The semiconductor device according to claim 21, further comprising:

a plurality of said power-supply circuits; and a switch circuit selectively applying said control signal to any of said plurality of said power-supply circuits.

* * * * *